(12) United States Patent
Totsuka

(10) Patent No.: US 6,657,335 B2
(45) Date of Patent: Dec. 2, 2003

(54) STEPPING MOTOR AND DRIVING APPARATUS HAVING SEPARATE POSITION DETECTION COIL

(75) Inventor: Shigeki Totsuka, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 2 days.

(21) Appl. No.: 09/826,359

(22) Filed: Apr. 5, 2001

(65) Prior Publication Data

US 2002/0047765 A1 Apr. 25, 2002

(30) Foreign Application Priority Data

Apr. 7, 2000 (JP) ........................................ 2000-106076

(51) Int. Cl.$^7$ ........................ H02K 11/00; H02K 37/00; H02K 9/00; H02K 1/00; H02K 19/26
(52) U.S. Cl. ..................... 310/68 B; 310/49 R; 310/46; 310/52; 310/53; 310/184
(58) Field of Search ............................... 310/184, 68 B, 310/53, 52, 49 R, 46, 40 R, 10; 318/159, 543, 34

(56) References Cited

U.S. PATENT DOCUMENTS

| | | | | |
|---|---|---|---|---|
| 1,105,155 A | * | 7/1914 | Mueller | 322/27 |
| 3,500,103 A | | 3/1970 | Swain et al. | 313/138 |

(List continued on next page.)

FOREIGN PATENT DOCUMENTS

| | | | | |
|---|---|---|---|---|
| DE | 44 34 577 A1 | 9/1994 | | |
| DE | 44 34 577 A1 | 4/1996 | | |
| EP | 1244200 A2 | * 9/2002 | .......... | H02K/37/16 |
| GB | 1 354 624 | 5/1974 | | |
| JP | 61-69364 | 4/1986 | | |
| JP | 2002107792 A | * 4/2002 | ............ | G03B/9/02 |

OTHER PUBLICATIONS

Copy of Australian Patent Office Communication including European Search Report for corresponding Australian Patent Application 35027/01 dated Aug. 14, 2002.
Patent Abstracts of Japan, vol. 010, No. 236, and JP 61 069364 A, Apr. 9, 1986 *abstract*.
Patent Abstracts of Japan, vol. 004, No. 141 and JP 55 092562 A, Jul. 14, 1980 *abstract*.

*Primary Examiner*—Nestor Ramirez
*Assistant Examiner*—Pedro J. Cuevas
(74) *Attorney, Agent, or Firm*—Armstrong, Westerman & Hattori, LLP

(57) ABSTRACT

A stepping motor which includes: exciting coils; a rotor provided with a plurality of N/S poles so as to rotate following a change of an excitation state of the exciting coils; and a detecting coil provided separately from the exciting coils so as to generate induction voltage according to rotation of the rotor. A driving apparatus including the stepping motor is provided, which further includes: a driven member linked with the rotor; a stopper to mechanically stop the driven member at a predetermined position; a first exciting means to normally or reversely rotate the rotor by controlling the excitation state of the exciting coils; a second exciting means to reverse the rotor in a direction of making the driven member move toward the predetermined position by controlling the excitation state of the exciting coils; a position detecting means to detect the driven member having abutted the stopper and stopped at the predetermined position on a basis of induction voltage generated in the detecting coil during control by the second exciting means; and a controlling means which stops the first exciting means controlling and starts the second exciting means controlling when an instruction signal is inputted, and which starts the first exciting means controlling and stops the second exciting means controlling when the position detecting means detects the driven member having stopped at the predetermined position.

2 Claims, 5 Drawing Sheets

U.S. PATENT DOCUMENTS

| | | | |
|---|---|---|---|
| 4,703,244 A | | 10/1987 | Takeuchi et al. ............ 318/696 |
| 4,841,214 A | * | 6/1989 | Ueda et al. ................. 318/685 |
| 4,855,629 A | * | 8/1989 | Sato ........................ 310/49 R |
| 4,857,817 A | * | 8/1989 | Kugioka .................... 318/685 |
| 5,070,264 A | | 12/1991 | Conrad .................... 310/68 B |
| 5,132,603 A | * | 7/1992 | Yoshimoto ................. 310/257 |
| 5,206,571 A | * | 4/1993 | Burri ........................ 318/685 |
| 5,291,111 A | * | 3/1994 | Hirano ...................... 318/101 |
| 5,329,195 A | * | 7/1994 | Horber et al. ............ 310/68 B |
| 5,503,131 A | | 4/1996 | Ohuchi ................. 123/568.24 |
| 5,520,150 A | | 5/1996 | Kimoto ................ 123/339.26 |
| 5,723,964 A | | 3/1998 | Nakaba ..................... 318/599 |
| 5,729,071 A | * | 3/1998 | Steiner ...................... 310/254 |
| 5,844,394 A | * | 12/1998 | Mushika et al. ............ 318/685 |
| 5,877,694 A | | 3/1999 | Kataoka .................... 340/688 |
| 5,912,521 A | * | 6/1999 | Ray ..................... 310/156.06 |
| 6,153,953 A | * | 11/2000 | Isozaki et al. .............. 310/112 |
| 6,163,126 A | * | 12/2000 | Kojima et al. .............. 318/685 |
| 6,211,585 B1 | * | 4/2001 | Sato et al. .................. 310/254 |
| 6,437,466 B1 | * | 8/2002 | Taghezout ............... 310/49 R |
| 6,504,272 B2 | * | 1/2003 | Sakamoto ............... 310/49 R |
| 2002/0135243 A1 | * | 9/2002 | Kotani et al. ............ 310/49 R |
| 3,831,072 A | * | 8/1974 | Tanikoshi ................... 318/138 |
| 4,142,140 A | | 2/1979 | Wiesner .................... 318/696 |
| 4,361,790 A | * | 11/1982 | Laesser et al. ............. 318/696 |
| 4,564,796 A | * | 1/1986 | Yoshino et al. ............ 318/685 |

* cited by examiner

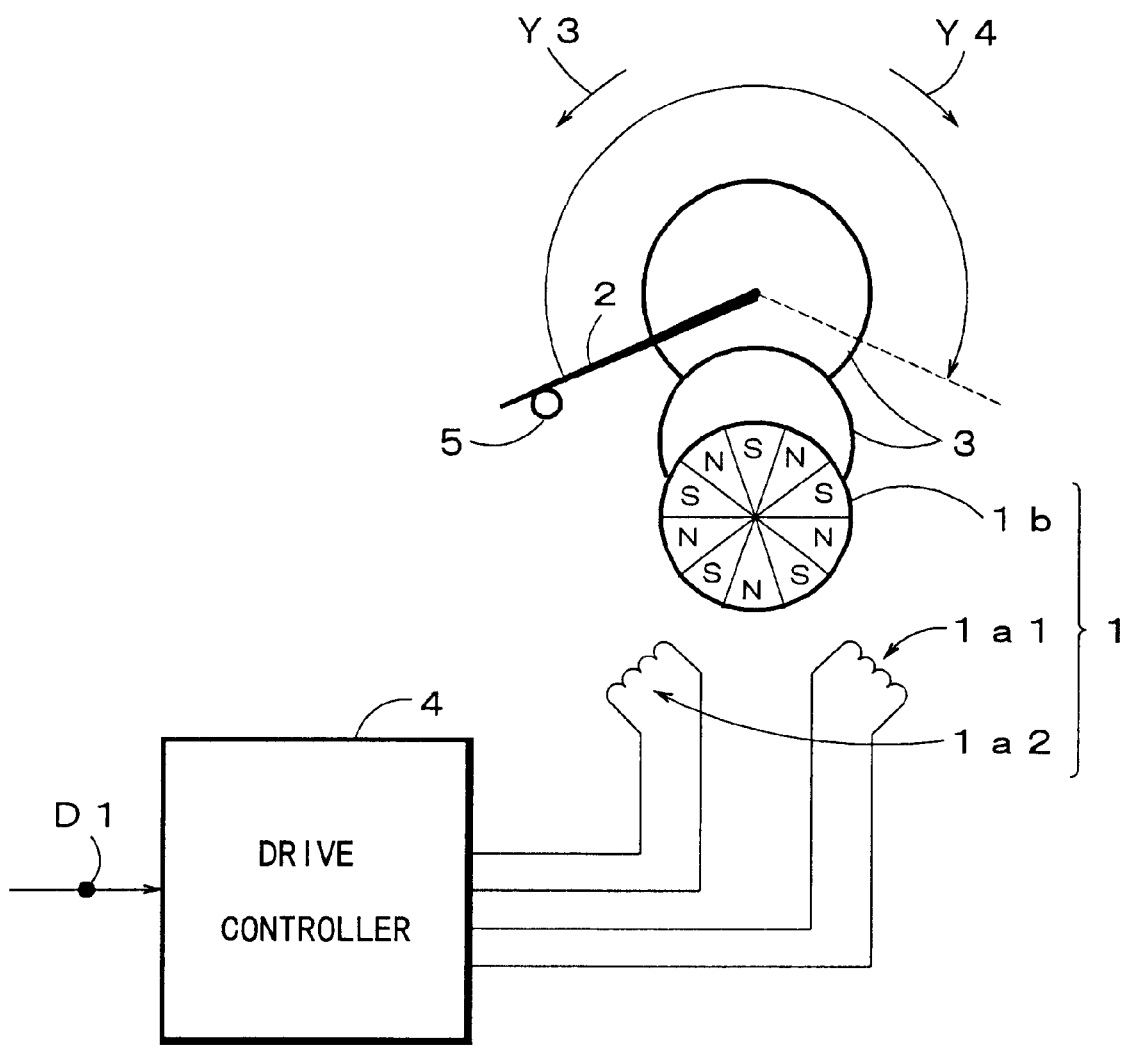

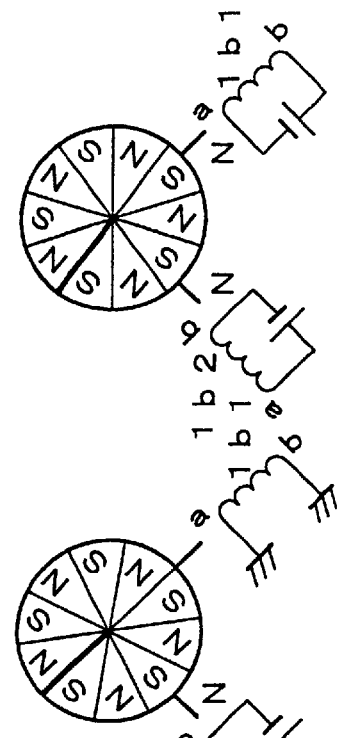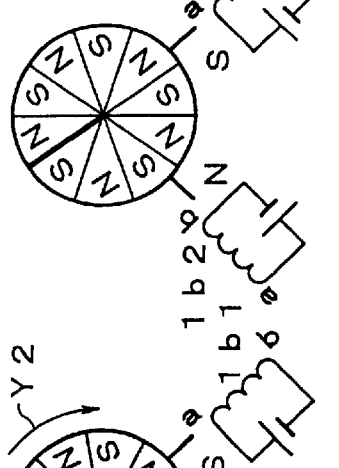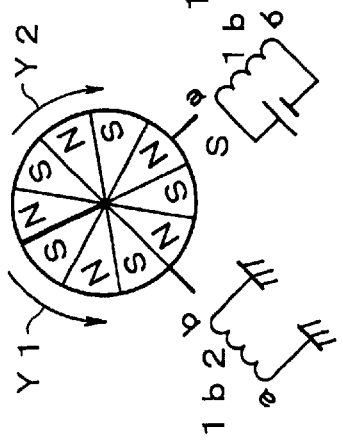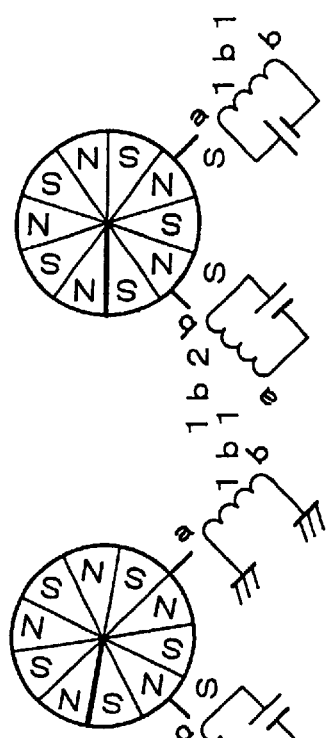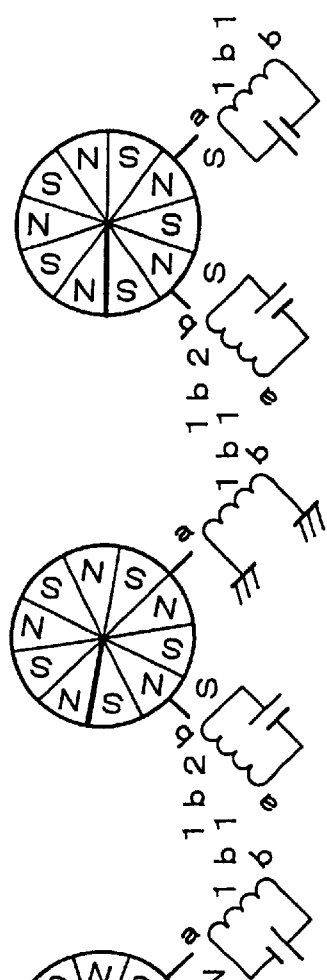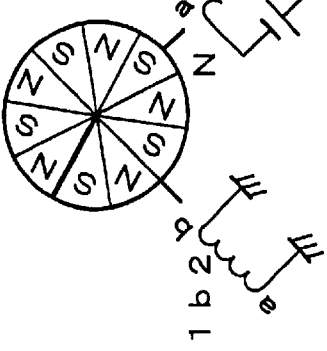

STEPPING MOTOR AND DRIVING APPARATUS HAVING SEPARATE POSITION DETECTION COIL

BACKGROUND OF THE INVENTION

1. Field of the Invention

The present invention relates generally to a stepping motor and a driving apparatus and, more particularly, to a stepping motor provided with exciting coils and a rotor provided with N/S poles so as to rotate following an excitation state of the exciting coils and also to a driving apparatus to drive a driven member by means of rotation of the stepping motor.

2. Description of the Related Art

An indicating apparatus, wherein a pointer for indicating, for example, a speed of a vehicle or a rotation speed of an engine is a driven member, is conventionally known as a driving apparatus having a stepping motor. The above indicating apparatus, as shown in FIG. 5, has a stepping motor 1 having exciting coils 1a1, 1a2 and a rotor 1b on which five sets of N/S poles are magnetized in turn and which rotates following a change of an excitation state of the exciting coils 1a1, 1a2, a pointer 2 being linked with the rotational drive of the rotor 1b, a gear 3 to transmit the rotational drive of the rotor 1b to the pointer 2, and a drive controller 4 to rotate the rotor 1b normally or reversely by controlling the excitation state of the exciting coils 1a1, 1a2.

Hereinafter, a relation between an excitation state of the exciting coils 1a1, 1a2 and rotation of the rotor 1b is described with reference to FIGS. 6A–6H. First, in an excitation state regulated at excitation step S1, that is, the b-side of the exciting coil 1a2 becomes a non-excited state and the exciting coil 1a2 becomes the S pole, the N pole of the rotor 1b is attracted toward the a-side of the exciting coil 1a1, and the rotor 1b becomes stable.

Next, excitation step S8 is reached. When the b-side of the exciting coil 1a2 becomes the N pole and the a-side of the exciting coil 1a1 becomes the S pole, the rotor 1b turns by 9 degrees in an arrow Y1 direction from the position of excitation step S1 and stops, whereby the pointer 2 shifts in an arrow Y3 direction (FIG. 5).

Following the above, when the b-side of the exciting coil 1a2 and the a-side of the exciting coil 1a1 are respectively controlled as follows:

N pole, non-excited state (excitation step S7)→
N pole, N pole (excitation step S6)→
non-excited state, N pole (excitation step S5)→
S pole, N pole (excitation step S4)→
S pole, non-excited state (excitation step S3)→
S pole, S pole (excitation step S2), the rotor 1b turns by 9 degrees each time following the change of the excitation state.

When the excitation state of excitation step S8 is generated again from excitation step S1, the rotor 1b rotates again by 9 degrees in the arrow Y1 direction and becomes stable. Like the above, the rotor 1b turns by 9 degrees every step in the arrow Y1 direction by repeatedly controlling the excitation state of the exciting coils 1a1, 1a2 according to the excitation pattern consisting of the excitation steps S8 to S1.

In order to rotate the rotor 1b in an arrow Y2 direction, the excitation state of the exciting coils 1a1, 1a2 is controlled according to a pattern opposite the above excitation pattern, i.e., from S1 toward S8, whereby the pointer 2 shifts in an arrow Y4 direction (FIG. 5).

Next, an operation of the above indicating apparatus used for a vehicle-speedometer, for example, is described hereinafter. An angle data D1 is supplied to the drive controller 4, which angle data D1 shows a rotation angle of the rotor 1b corresponding to a travel which is a difference between a target position of the pointer 2 and a present position thereof. The target position of the pointer 2 is calculated on the basis of speed information from a speed sensor. By means of the drive controller 4 controlling an excitation state of the exciting coils 1a1, 1a2 according to this angle data D1, the pointer 2 shifts by only the above travel and indicates the target position.

With respect to the above indicating apparatus, however, a power swing caused by an input of the angle data D1 affected by vibration and noise of the vehicle body could be brought about, wherein an actual travel of the pointer 2 differs from the target travel of the pointer 2. If the power swing is repeated, a difference arises between the speed indicated by the pointer 2 and the speed information from the speed sensor, whereby the indicating apparatus can not carry out an accurate indication.

In order to solve such a problem, as shown in FIG. 5, a stopper 5 is provided at a position at which the pointer 2 indicates zero (for example, 0 km/h) so as to stop the pointer 2 thereat by shifting the pointer 2 toward the stopper 5 every timing of ignition ON/OFF or battery connection. That is, a reset operation to reset the difference between the speed indicated by the pointer 2 and the speed information from the speed sensor is carried out. Hereinafter, a rotation in the arrow Y1 direction is called a reverse rotation. On the contrary, a rotation in the arrow Y2 direction is called a normal rotation.

With respect to the above prior art indicating apparatus, however, the rotor 1b has to be reversed so that the pointer 2 securely abuts the stopper 5. That is, the rotor 1b has to be reversed so that the pointer 2 can return larger than a normal deflection. Therefore, because the above reset operation has to be carried out regardless of the presence or absence of the difference between the speed indicated by the pointer 2 and the speed information from the speed sensor, much time is required for the reset operation.

Because the excitation state of the exciting coils 1a1, 1a2 is continuously controlled even though the pointer 2 has fully returned to the stopper 5, the pointer 2 repeats abutting and leaving the stopper 5, thereby making an unpleasant clattering noise.

In order to solve the above problem, the indicating apparatus which closes the reset operation simultaneously with the abutment of the pointer 2 against the stopper 5 is proposed. That is, because an induction voltage is generated in the exciting coil 1a1 or 1a2 being in a no-excited state while the pointer 2 is not in contact with the stopper 5 and therefore the rotor 1b is moving, and, on the other hand, because an induction voltage is not generated in the exciting coil being in a non-excited state while the pointer 2 is in contact with the stopper 5 and, therefore, the rotor 1b is stopping, the voltage generated in either, being in the non-excited state, of the exciting coils can be detected at a timing of the exciting coil being controlled into the non-excited state.

Whether or not the induction voltage has been generated is judged, and if yes, movement of the pointer 2 is stopped on a judgment that the pointer 2 has abutted the stopper 5.

However, the rotor 1b is not likely to stop immediately after the pointer 2 abutted the stopper 5 but to further turn by some gap of gears 3.

The rotor 1b is continuously controlled to reverse in the state that the pointer 2 is in contact with the stopper 5, the rotor 1b sometimes normally rotates at a timing of the exciting coils 1a1, 1a2 being changed to the proper excited states.

Specifically, if the pointer 2 is to abut the stopper 5, for example, in a state of the exciting coils 1a1, 1a2 being in the excitation state regulated at excitation step S2, and when the pointer 2 is abutting the stopper 5 and the rotor 1b is stopping at the position shown in excitation step S2, the rotor 1b could normally rotate near excitation step S4 if the exciting coils 1a1, 1a2 are continuously controlled according to an excitation pattern of S1→S8→S7→S6→S5→S4→S3→S2→S1 . . . .

Induction voltage is generated by the normal rotation of the rotor 1b at step S3 even though the pointer 2 has already abutted the stopper 5, and therefore it can not be detected that the pointer 2 has arrived at the predetermined. A time-period of a completely stopping state of the rotor after the abutment of the pointer 2 against the stopper 5 is the one from excitation step S8 to excitation step S5 and is a very short. The time-period of the completely stopping state of the rotor after the abutment of the pointer 2 against the stopper 5 could become shorter according to a state of magnetization of the rotor 1b and so on.

With respect to the prior art apparatus, however, because the presence of the induction voltage can be detected only at the timing of the non-excited state, detection of the abutment of the pointer 2 against the stopper 5 would be difficult.

SUMMARY OF THE INVENTION

In view of the foregoing, an object of the present invention is to provide a stepping motor which can securely detect an abutment of a driven member against a stopper and a driving apparatus which can also securely detect an abutment of a driven member against a stopper.

In order to achieve the above object, as a first aspect of the present invention, a stepping motor comprises: exciting coils; a rotor provided with a plurality of N/S poles so as to rotate following a change of an excitation state of the exciting coils; and a detecting coil provided separately from the exciting coils so as to generate induction voltage according to rotation of the rotor.

According to the present invention with the first aspect, because the detecting coil is provided in addition to the exciting coils, the presence or absence of induction voltage generated in the detecting coil can be detected at each excitation step. Therefore, because whether or not the rotor is turning or stopping can be judged, the abutment of the driven member against the stopper can be securely detected.

As a second aspect of the present invention, based on the first aspect, the exciting coils are provided along a peripheral surface of the rotor, and the detecting coil is provided at a center of a longest peripheral surface between adjoining exciting coils.

According to the present invention with the second aspect, because the detecting coil is provided at a center of a longest peripheral surface between adjoining exciting coils, the detecting coil can be prevented from receiving an influence from the excitation state of the exciting coils, thereby further securely ensuring detection of the abutment of the driven member against the stopper.

As a third aspect of the present invention, a driving apparatus comprises: a stepping motor having: exciting coils, a rotor provided with a plurality of N/S poles so as to rotate following a change of an excitation state of the exciting coils, and a detecting coil provided separately from the exciting coils so as to generate induction voltage according to rotation of the rotor; a driven member linked with the rotor; a stopper to mechanically stop the driven member at a predetermined position; a first exciting means to normally or reversely rotate the rotor by controlling the excitation state of the exciting coils; a second exciting means to reverse the rotor in a direction of making the driven member move toward the predetermined position by controlling the excitation state of the exciting coils; a position detecting means to detect the driven member having abutted the stopper and stopped at the predetermined position on a basis of induction voltage generated in the detecting coil during control by the second exciting means; and a controlling means which stops the first exciting means controlling and starts the second exciting means controlling when an instruction signal is inputted, and which starts the first exciting means controlling and stops the second exciting means controlling when the position detecting means detects the driven member having stopped at the predetermined position.

According to the present invention with the third aspect, in the stepping motor, the rotor provided with a plurality of N/S poles rotates following a change of an excitation state of the exciting coils, and the detecting coil provided separately from the exciting coils generates an induction voltage according to rotating of the rotor. The stopper mechanically stops the driven member at a predetermined position. In addition, the first exciting means normally or reversely rotates the rotor by controlling the excitation state of the exciting coils. Further, the second exciting means reverses the rotor in a direction of making the driven member move toward the predetermined position by controlling the excitation state of the exciting coils.

The position detecting means detects the driven member having abutted the stopper and stopped at the predetermined position on a basis of induction voltage generated in the detecting coil during control by the second exciting means. The controlling means stops the first exciting means controlling and starts the second exciting means controlling when an instruction signal is inputted, and also starts the first exciting means controlling and stops the second exciting means controlling when the position detecting means detects the driven member having stopped at the predetermined position.

Therefore, because the detecting coil is provided in addition to the exciting coils, the presence or absence of an induction voltage generated in the detecting coil can be detected at each excitation stop. Therefore, because whether or not the rotor is turning or stopping can be judged, the abutment of the driven member against the stopper can be securely detected in the driving apparatus.

The above and other objects and features of the present invention will become more apparent from the following description taken in conjunction with the accompanying drawings.

BRIEF DESCRIPTION OF THE DRAWINGS

FIG. 5 is a diagram showing a prior art indicating apparatus as the driving apparatus in which a conventional stepping motor is mounted; and FIGS. 6A–6H are diagrams each showing a relation between an excitation state of the exciting coils and rotation of the rotor.

DESCRIPTION OF THE PREFERRED EMBODIMENT(S)

An embodiment of the present invention will now be described in further detail with reference to the accompanying drawings.

Figure 1:
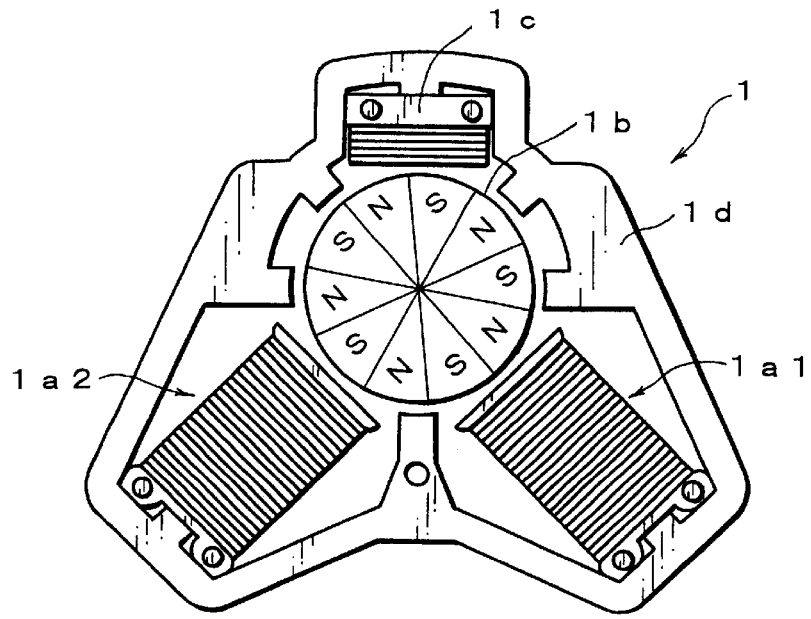
FIG. 1 is a diagram showing an embodiment of a stopping motor of the present invention.

FIG. 1 is a diagram showing an embodiment of a stepping motor fo the present invention. The stepping motor 1 has exciting coils 1a1, 1a2 wound upon a stator 1d, a rotor 1b on which five sets of N/S poles are magnetized in turn and which rotates following a change of an excitation state of the exciting coils 1a1, 1a2, and detecting coil 1c in which induction voltage is generated according to rotation of the rotor 1b.

Figure 2:
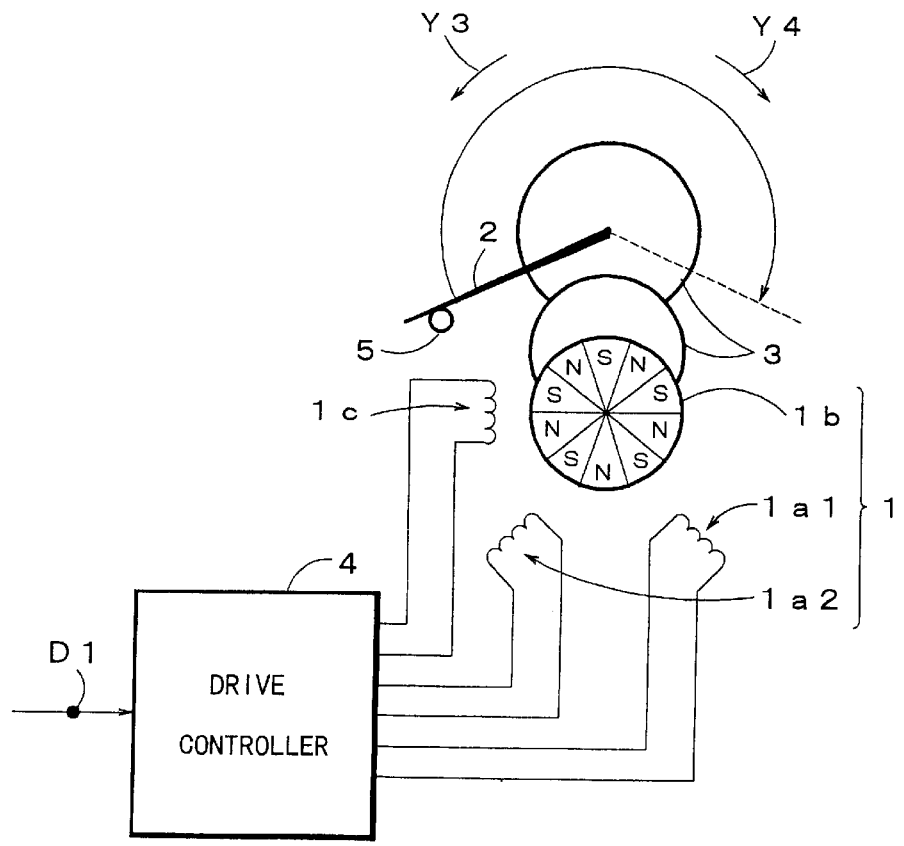
FIG. 2 is a diagram showing an indicating apparatus as a driving apparatus in which the stepping motor of FIG. 1 is mounted.

The above stepping motor 1, as shown in FIG. 2, is a component of an indicating apparatus, which stepping motor acts as a driving apparatus to drive a pointer being a driven member. The indicating apparatus has a pointer 2 as the driven member being linked with the rotor 1b, a gear 3 to transmit the rotational drive of the rotor 1b to the pointer 2, a drive controller 4 to rotate the rotor 1b normally or reversely by controlling the excitation state of the exciting coils 1a1, 1a2, and a stopper 5 to mechanically stop the pointer 2 at a zero position (a predetermined position).

Next, the structure of the above drive controller 4 is described. The drive controller 4, as shown in FIG. 3, has a first excitation circuit 4a (a first exciting means) to control the excitation state of the exciting coils 1a1, 1a2 by outputting an excitation pulse (not shown) to rotate the rotor 1b normally or reversely according to an angle data D1, and a second excitation circuit 4b (a second exciting means) to control the excitation state of the exciting coils 1a1, 1a2 by outputting excitation pulses P11–P14 to reverse the rotor 1b.

Figure 4:
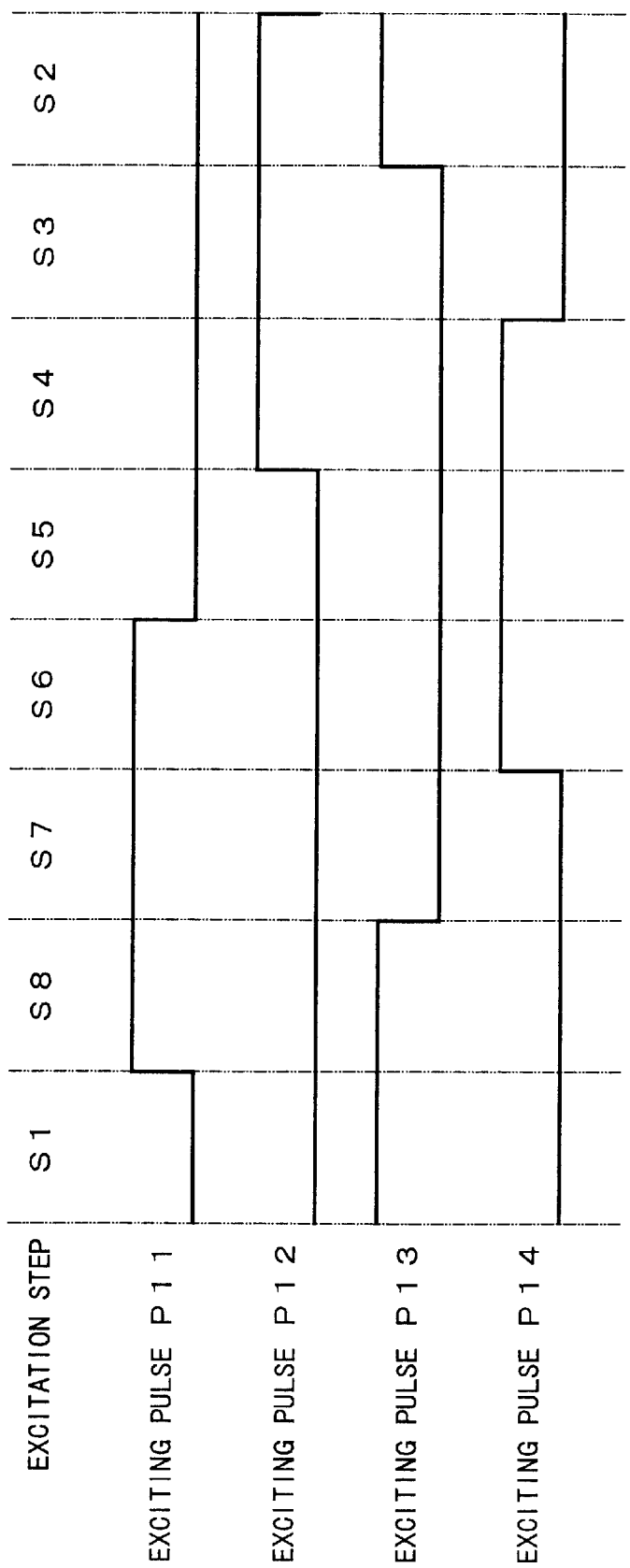
FIG. 4 is a timing chart of excitation pulses outputted from a second excitation circuit of FIG. 3.

As shown in FIG. 4, the above excitation pulses P11–P14 have different phases from each other so that the rotor 1b can turn by 9 degrees per one step. By inputting the excitation pulses P11–P14 to the a-side and the b-side of the exciting coil 1a2 and to the b-side and the a-side of the exciting coil 1a1, the excitation state of the exciting coils 1a1, 1a2 changes correspondingly to excitation steps S8 to S1 as shown in FIG. 4, and the rotor 1b reverses following the change of the excitation state.

Figure 3:
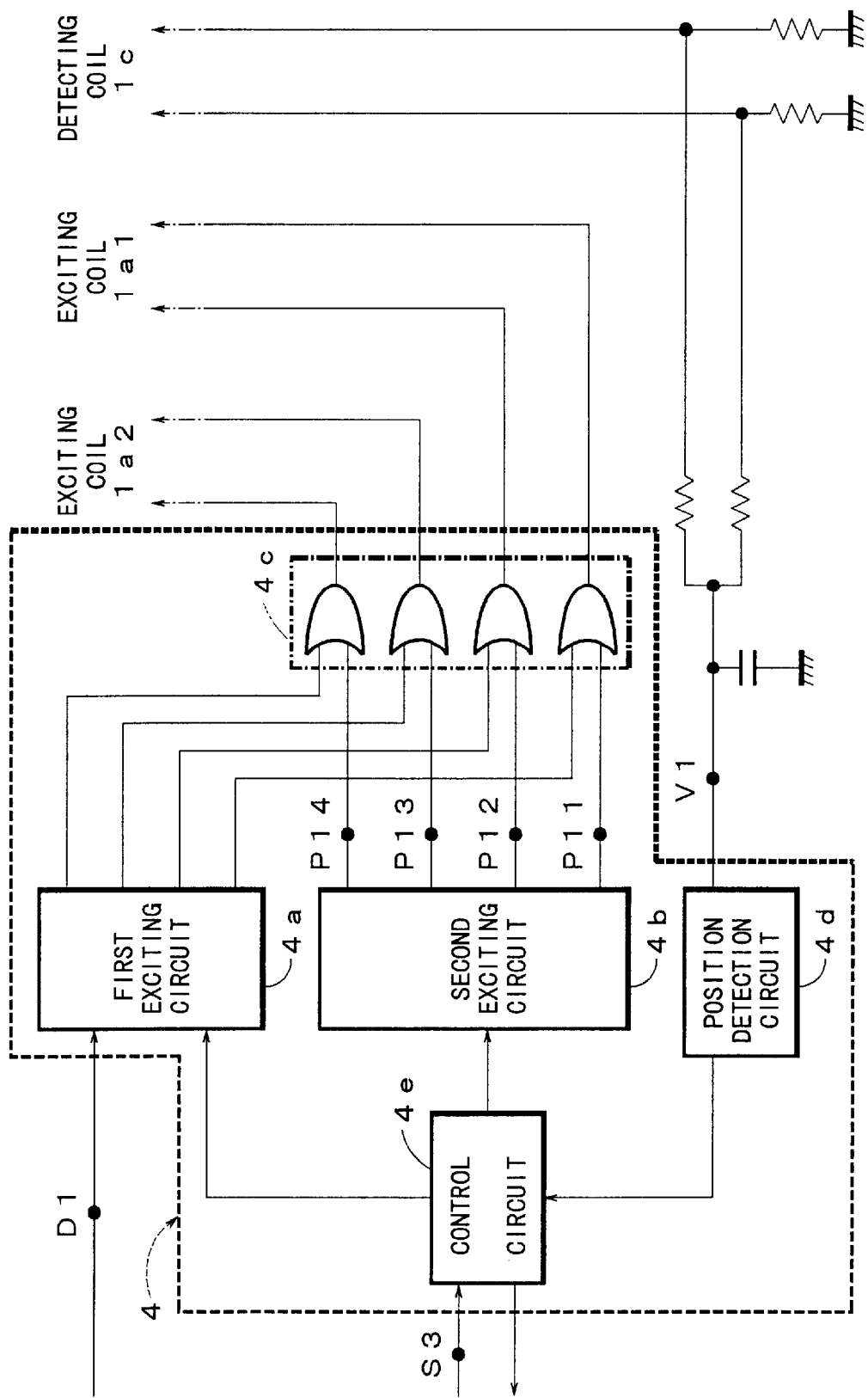
FIG. 3 is a circuit diagram showing a drive controller of the indicating apparatus of FIG. 2.

The drive controller 4, as shown in FIG. 3, has a selector circuit 4c, consisting of four OR gates, to output any of pulses outputted from the first excitation circuit 4a and of the excitation pulses P11–P14 to the exciting coils 1a1, 1a2, and a position detection circuit 4d (a position detecting means) to receive a voltage V1 applied to the detecting coil 1c every excitation step, to judge the presence or absence of the induction voltage on the basis of the voltage V1, and to detect whether or not the rotor 1b is turning or stopping with the pointer 2 being abutting the stopper 5 at the zero position.

The drive controller 4 further has a control circuit 4e (a controlling means), which stops the control by the first excitation circuit 4a when an instruction signal S3 outputted at the timing of the ignition ON/OFF, the connection with the vehicle-mounted battery, or the like, is inputted and starts the control by the second excitation circuit 4b, and which starts the control by the first excitation circuit 4a when the position detection circuit 4d detects the stopping of the pointer 2 at the zero position with abutting the stopper 5 and stops the control by the second excitation circuit 4b.

An operation of the above indicating apparatus is described hereinafter. When the instruction signal S3 is outputted, the control circuit 4e starts the reset operation and outputs the rejection signal to make the first excitation circuit 4a reject to input of the angle data D1. With the input of the rejection signal, the first excitation circuit 4a stops outputting the excitation pulse so as to stop the control of the excitation state of the exciting coils 1a1, 1a2.

The control circuit 4e makes the second excitation circuit 4b output the excitation pulses P11–P14 to start the control of the exciting coils 1a1, 1a2. When the excitation pulses P11–P14 are inputted, the exciting coils 1a1, 1a2 are excited according to excitation steps shown in FIG. 4, whereby the rotor 1b reverses every 9 degrees. The pointer 2 is shifted toward the stopper 5.

At this time, if the pointer 2 is rotating in the arrow Y3 direction, induction voltage is generated in the detecting coil 1c with the 9 degrees rotation of the rotor 1b at each excitation step. On the other hand, while the pointer 2 is stopping with abutting the stopper 5, no voltage is induced in the detecting coil 1c. Therefore, when it is judged at each excitation step that the induction voltage is not generated on the basis that the voltage V1 from the detecting coil 1c is not more than a specified value according to a non-shown comparison device, a detection signal, which indicates that the pointer 2 is stopping with abutting the stopper 5, is outputted to the control circuit 4e.

The control circuit 4e stops outputting the rejection signal according to this detection signal, whereby the control by the first excitation circuit 4a is started, the output of the excitation pulses P11–P14 from the second excitation circuit 4b is stopped, and the control by the second excitation circuit 4b is stopped, thereby stopping the reset operation.

As stated above, because the detecting coil 1c is provided besides the exciting coils 1a1, 1a2, the presence or absence of induction voltage generated in the detecting coil 1c can be detected at each excitation step. That is, whether or not the rotor 1b is turning or stopping can be judged. Therefore, the abutment of the pointer 2 against the stopper 5 can be securely detected.

As shown in FIG. 1, the exciting coils 1a1, 1a2 are provided along the peripheral surface of the rotor 1b at an angle of 90 degrees (not shown) to each other. The detecting coil 1c is provided along the longer peripheral surface between the exciting coils 1a1, 1a2 at the center thereof.

In case that more than two exciting coils are provided, the detecting coil 1c is provided along the longest peripheral surface, at the center thereof, between the adjoining two exciting coils.

Therefore, the detecting coil 1c can be prevented from receiving an influence from the excitation state of the exciting coils 1a1, 1a2, thereby further securely ensuring to detect the abutment of the driven member against the stopper 5.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A stepping motor, comprising:
   exciting coils;
   a rotor provided with a plurality of N/S poles so as to rotate following a change of an excitation state of the exciting coils; and a detecting coil provided separately from the exciting coils so as to generate an induction voltage according to rotation of the rotor, wherein the exciting coils are provided along a peripheral surface of the rotor, and the detecting coil is provided at a center of a longest peripheral surface between adjoining exciting coils.

2. A driving apparatus, comprising:

a stepping motor having:
 exciting coils;
 a rotor providing with a plurality of N/S poles so as to rotate following a change of an excitation state of the exciting coils; and
 a detecting coil provided separately from the exciting coils so as to generate induction voltage according to rotation of the rotor;

a driven member linked with the rotor;

a stopper for mechanically stopping the driven member at a predetermined position;

a first exciting means to normally or reversely rotate the rotor by controlling the excitation state of the exciting coils;

a second exciting means for reversing the rotor in a direction of making the driven member move toward the predetermined position by controlling the excitation state of the exciting coils;

a position detecting means for detecting the driven member having abutted the stopper and stopped at the predetermined position on a basis of induction voltage generated in the detecting coil during control by the second exciting means; and a controlling means for stopping the first exciting means controlling and starting the second exciting means controlling when an instruction signal is inputted, and for starting the first exciting means controlling and stopping the second exciting means controlling when the position detecting means detects the driven member having stopped at the predetermined position, wherein the exciting coils are provided along a peripheral surface of the rotor, and the detecting coil is provided at a center of a longest peripheral surface between adjoining exciting coils.

* * * * *